(12) United States Patent
Takenaka

(10) Patent No.: US 6,171,897 B1
(45) Date of Patent: Jan. 9, 2001

(54) METHOD FOR MANUFACTURING CMOS SEMICONDUCTOR DEVICE

(75) Inventor: Masahiro Takenaka, Nara (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/048,836

(22) Filed: Mar. 27, 1998

(30) Foreign Application Priority Data

Mar. 28, 1997 (JP) .................................................. 9-076380

(51) Int. Cl.[7] .............................................. H01L 21/8238
(52) U.S. Cl. ........................................... 438/232; 438/532
(58) Field of Search .................................... 438/229, 230, 438/231, 232, 532

(56) References Cited

U.S. PATENT DOCUMENTS

| | | | |
|---|---|---|---|
| 4,703,552 | * 11/1987 | Baldi et al. | 438/232 |
| 5,021,354 | * 6/1991 | Pfiester | 438/230 |
| 5,021,356 | * 6/1991 | Henderson et al. | 438/532 |
| 5,567,642 | * 10/1996 | Kim et al. | 438/232 |

FOREIGN PATENT DOCUMENTS 7-153847     6/1995   (JP) .

* cited by examiner

Primary Examiner—Chandra Chaudhari
(74) Attorney, Agent, or Firm—Nixon & Vanderhye P.C.

(57) ABSTRACT

A method for manufacturing a CMOS semiconductor device having a first conductivity type (1st-type) MOS transistor including a gate electrode made of a 1st-type polysilicon film of high impurity concentration and a second conductivity type (2nd-type) MOS transistor including a gate electrode made of a 2nd-type polysilicon film of high impurity concentration on a single semiconductor substrate, comprising the steps of: forming a polysilicon film on the substrate; forming a first resist mask on the polysilicon film so as to cover a 2nd-type MOS transistor formation region, followed by implanting a 1st-type impurity at a high concentration into the polysilicon film by using the first resist mask; removing the first resist mask; forming a second resist mask on the polysilicon film so as to cover a 1st-type MOS transistor formation region, followed by implanting a 2nd-type impurity at a high concentration into the polysilicon film by using the second resist mask; etching the 2nd-type polysilicon film by a specific thickness by using the second resist mask; removing the second resist mask; thermally treating for uniformizing the impurity concentration in the 1st-type and 2nd-type polysilicon film; forming a third resist mask on the 1st-type and 2nd-type polysilicon film; and etching the 1st-type and 2nd-type polysilicon film simultanously by using the third resist mask thereby forming the gate electrode made of the 1st-type and 2nd-type polysilicon film of high impurity concentration.

3 Claims, 4 Drawing Sheets

US 6,171,897 B1

METHOD FOR MANUFACTURING CMOS SEMICONDUCTOR DEVICE

CROSS-REFERENCE TO RELATED APPLICATIONS

This application is related to Japanese application No. Hei 9(1997)-076380, filed on Mar. 28, 1997 whose priority is claimed under 35 USC § 119, the disclosure of which is incorporated by reference in its entirety.

BACKGROUND OF THE INVENTION

1. Field of the Invention

The present invention relates to a method for manufacturing a CMOS semiconductor device. More particularly, the present invention relates to a method for manufacturing a CMOS semiconductor device having a p type gate and an n type gate (dual gates) on a single semiconductor substrate.

2. Related Arts

A conventional method for manufacturing a CMOS semiconductor device having dual gates is shown in FIG. 2(a) to FIG. 2(c).

A device isolation region 32 is formed in a silicon substrate 31. Then, an NMOS transistor formation region 33 which is to become an NMOS region and a PMOS transistor formation region 34 which is to become a PMOS region are formed in the silicon substrate 31. Next, a gate insulating film 35 is formed on the surface of both the NMOS transistor formation region 33 and the PMOS transistor formation region 34. Then, a polysilicon film 36 is deposited on the entire surface of the silicon substrate 31(FIG. 2(a)).

A resist mask 37a is formed on the polysilicon film 36 so as to cover the PMOS transistor formation region 34. Next, n type impurity ions are implanted at a high concentration into the polysilicon film 36 in exposed state to form a high concentration n type polysilicon film 38 on the NMOS transistor formation region 33 (FIG. 2(b)).

The resist mask 37a is removed. Then, a resist mask 37b is formed on the n type polysilicon film 38 so as to cover the NMOS transistor formation region 33. Then, p type impurity ions are implanted at a high concentration into the polysilicon film 36 in exposed state to form a high concentration p type polysilicon film 39 on the PMOS transistor formation region 34 (FIG. 2(c)).

The resist mask 37b is removed. Next, a thermal-treatment is conducted in order to uniformize the impurity concentration in both of the n type polysilicon film 38 and the p type polysilicon film 39. A resist film is formed on the entire surface of the silicon substrate Then, a resist mask 37c is formed by patterning the resist film. Both the n type polysilicon film 38 and the p type polysilicon film 39 are etched with the resist mask 37c used as a mask, whereby an n type gate electrode 40 is formed on the NMOS transistor formation region 33 and a p type gate electrode 41 is formed on the PMOS transistor formation region 34.

Generally, an etching rate of the high concentration n type polysilicon film 38 and that of the high concentration p type polysilicon film 39 are different. Therefore, if the n type polysilicon film 38 is etched simultaneously with the p type polysilicon film 39 in a step for forming the gate electrodes, the n type polysilicon film 38 having a larger etching rate is completely etched and besides, the silicon substrate 31 of the NMOS transistor formation region 33 is over-etched, thereby causing a rough surface on the substrate as shown in FIG. 3(a). On the other hand, if the p type polysilicon film 39 is etched simultaneously with the n type polysilicon film 38 in a step for forming the gate electrodes, the p type polysilicon film 39 having a smaller etching rate is not fully etched, as shown in FIG. 3(b), thereby causing a problem such as a short-circuit.

The thinner a gate oxide film becomes in accordance with the size reduction of LSI, the bigger the above-mentioned problem becomes. Moreover, this problem can be a cause of extremely decreasing a process precision and reliability of the transistor.

To avoid this problem, a method is considered, which involves conducting an etching of the n type polysilicon film 38 and of the p type polysilicon film 39 separately.

However, in accordance with this method, another alignment process for forming a photo-resist mask is necessary. Accordingly, there arise problems such as lower productivity and higher production costs.

SUMMARY OF THE INVENTION

Thus, the present invention provides a method for manufacturing a CMOS semiconductor device having a first conductivity type MOS transistor including a gate electrode made of a first conductivity type polysilicon film of high impurity concentration and a second conductivity type MOS transistor including a gate electrode made of a second conductivity type polysilicon film of high impurity concentration on a single semiconductor substrate, comprising the steps of:

forming a polysilicon film on the semiconductor substrate;

forming a first resist mask on the polysilicon film so as to cover a second conductivity type MOS transistor formation region, followed by implanting a first conductivity type impurity at a high concentration into the polysilicon film by using the first resist mask;

removing the first resist mask;

forming a second resist mask on the polysilicon film so as to cover a first conductivity type MOS transistor formation region, followed by implanting a second conductivity type impurity at a high concentration into the polysilicon film by using the second resist mask;

etching the second conductivity type polysilicon film by a specific thickness by using the second resist mask;

removing the second resist mask;

thermally treating for uniformizing the impurity concentration in the first conductivity type polysilicon film and the second conductivity type polysilicon film;

forming a third resist mask on the first conductivity type polysilicon film and the second conductivity type polysilicon film; and etching the first conductivity type polysilicon film and the second conductivity type polysilicon film simultaneously by using the third resist mask thereby forming the gate electrode made of the first conductivity type polysilicon film of high impurity concentration and the gate electrode made of the second conductivity type polysilicon film of high impurity concentration.

DETAILED DESCRIPTION OF THE PREFERRED EMBODIMENTS

Figure 1A:
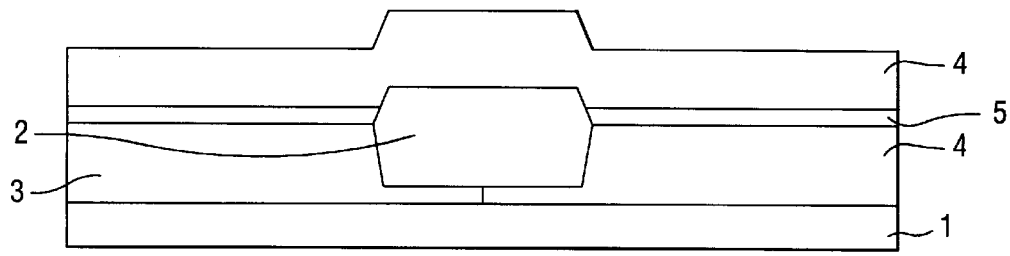
FIGS. 1(a) to 1(e) are schematic sectional views of a principal part illustrating manufacturing steps for a CMOS semiconductor device in accordance with the present invention.

The semiconductor device prepared by means of the manufacturing method of the present invention is a CMOS semiconductor device having a PMOS transistor and an NMOS transistor. The PMOS transistor and the NMOS transistor are formed and arranged on a single semiconductor substrate.

A semiconductor substrate to be used in the present invention may be any substrate that can be used for a semiconductor device. Examples of the semiconductor substrates are substrate of semiconductors such as silicon and germanium, compound semiconductors such as SiGe, GeAs and InGaAs and the like, but are not limited thereto. Among them, a silicon substrate is preferred. The semiconductor substrate may have a p type or an n type conductivity. In order to form both the NMOS transistor and the PMOS transistor, the semiconductor substrate may have one or more n type impurity diffusion regions (NMOS transistor formation regions) and/or one or more p type impurity diffusion regions (PMOS transistor formation regions). As regards the impurity, phosphorus, arsenic or the like may be employed as an n type impurity and boron or the like may be employed as a p type impurity. In the present invention, a first conductivity type means a p type or an n type. A second conductivity type means an n type in the case that the first conductivity type is a p type, and a p type in the case that the first conductivity type is an n type. Hereafter, the present invention is explained with regard to a case in which the first conductivity type is an n type and a second conductivity type is a p type.

The semiconductor substrate to be used in the present invention may optionally has a device isolation region, a gate insulating film, a circuit consisting of transistors or capacitors in a desired region, an insulating film or the like. The device isolation region may be formed by means of a conventional method such as a LOCOS method, a trench device isolation method or the like. The gate insulating film may be formed by means of a conventional method such as a thermal-oxidation method, a CVD method and the like. A thickness of the gate insulating film may be, for example, about 3 to about 10 nm.

The PMOS transistor and the NMOS transistor formed on the above-mentioned semiconductor substrate mainly consist of the gate insulating film, a gate electrode in which an impurity is diffused at a high concentration and a source/drain region.

Hereafter, the method for manufacturing the semiconductor device in the present invention is explained.

A polysilicon film is formed on the semiconductor substrate. The polysilicon film may be formed by means of a conventional method such as a CVD method. The thickness of the polysilicon film may be appropriately adjusted depending on a performance of the semiconductor device. For example, The thickness of the polysilicon film may be about 100 to about 400 nm.

An n type impurity is implanted into the polysilicon film formed on the NMOS transistor formation region. At this time, the PMOS transistor formation region is covered with a resist mask in advance. The condition for implanting the n type impurity into the polysilicon film may be controlled depending on the thickness of the polysilicon film. For example, in the case that $^{31}P^+$ or $^{75}As^+$ is used as the n type impurity, the implantation is preferably conducted with an implantation energy of about 10 to about 50 keV in a dose of about $3 \times 10^{14}$ to about $3 \times 10^{15}$ ions/cm$^2$. Thereby, the polysilicon film existing on the NMOS transistor formation region turns into an n type polysilicon film containing the n type impurity of high concentration such as about $1 \times 10^{19}$ to about $1 \times 10^{20}$ ions/cm$^3$.

A p type impurity is implanted into the polysilicon film formed on the PMOS transistor formation region. At this time, the NMOS transistor formation region is covered by a resist mask in advance. The condition for implanting the p type impurity into the polysilicon film may be controlled depending on the thickness of the polysilicon film. For example, in the case that $^{11}B^+$ or $^{49}BF_2^+$ is used as the p type impurity, the implantation is preferably conducted with an implantation energy of about 5 to about 25 keV in a dose of about $3 \times 10^{14}$ to about $3 \times 10^{15}$ ions/cm$^2$. Thereby, the polysilicon film existing on the PMOS transistor formation region turns into a p type polysilicon film containing the p type impurity of high concentration such as about $1 \times 10^{19}$ to about $1 \times 10^{20}$ ions/cm$^3$.

Concentrations of the n type impurity and the p type impurity in the polysilicon film may be the same or different as far as a resistance value of the polysilicon containing such impurity is sufficiently low.

Next, the p type polysilicon film of high impurity concentration is etched by a predetermined thickness by again employing the resist mask used for the implantation of the p type impurity into the above-mentioned polysilicon film. At this time, the etching method is not particularly limited. Examples of the methods are a wet etching method utilizing a solution of HF, $HNO_3$ or $CH_3CO_2H$, a chemical dry etching method utilizing fluorine-containing gas such as $CF_4$ or $SF_6$, a reactive-ion etching method utilizing a halogen-containing gas such as $Cl_2$, HBr or the like.

The thickness to be etched of the polysilicon film at this time may be controlled depending on the original thickness of the polysilicon film, the impurity concentration of each conductivity type contained in the polysilicon film, a later-mentioned method for etching both the n type polysilicon film of high impurity concentration and the p type polysilicon film of high impurity concentration at the same time, the condition in this etching method and the like. For example, the etching rates of the n type polysilicon film of high impurity concentration and the p type polysilicon film of high impurity concentration are represented by A(nm/min.) and B(nm/min.), respectively, and the total thickness of the polysilicon film is represented by C(nm) in the later-mentioned method for etching both the n type polysilicon film of high impurity concentration and the p type polysilicon film of high impurity concentration at the same time. The thickness to be etched of the polysilicon film can be desirably calculated by the following formula:

$$C \times (|A-B|/A)(nm) \quad (1).$$

That is, it takes C/A (min.) to completely etch (just etching) the n type polysilicon film of high impurity concentration (the polysilicon film having a larger etching rate) by a thickness of C (nm) under the above-mentioned condition for etching both the n type polysilicon film of high impurity concentration and the p type polysilicon film of high impurity concentration at the same time, C (nm) being the total thickness of the polysilicon. During this period of C/A (min.), the p type polysilicon film of high impurity concentration (the polysilicon film having a smaller etching rate) is etched by a thickness of (C×B)/A (nm). Accordingly, a thickness of the remaining p type polysilicon film of high impurity concentration which has not been etched is {C−(C×B)/A}(nm). Therefore, the p type polysilicon film of high impurity concentration is to be etched by a thickness which is a product of the total thickness of the polysilicon film and a value obtained by dividing the absolute value of the difference between the etching rate of the n type polysilicon film of high impurity concentration and the etching rate of the p-silicon polysilicon film of high impurity concentration by the etching rate of the n type polysilicon film of high impurity concentration.

Specifically, the original thickness of the polysilicon film is, for example, about 100 to about 400 nm as mentioned above, an appropriate thickness to be etched is about 7.5 to about 30 nm, though it depends on the method and the condition for etching as mentioned below.

Then, the resist mask covering the NMOS transistor formation region is removed. In order to uniformize the concentration of the n type impurity and the p type impurity in the polysilicon films, a thermal-treatment (for example, at a temperature of about 800 to about 1000° C. in an atmosphere of nitrogen gas for about 10 to about 100 minutes) is conducted. Again, a resist mask having a desired pattern is formed in order to pattern gate electrodes constituting the NMOS transistor and the PMOS transistor. The resist mask may be formed by means of a known method such as photolithography and etching step. Each gate electrode constituting the NMOS transistor and the PMOS transistor may be formed with certainty by etching the n type polysilicon film of high impurity concentration and the p type polysilicon film of high impurity concentration at the same time by means of the resist mask thus formed. Namely, the gate electrodes may be formed on the NMOS transistor formation region and on the PMOS transistor formation region without the need for etching each of the p type polysilicon film of high impurity concentration and the n type polysilicon film of high impurity concentration separately and moreover, without over-etching or less-etching.

Examples of the methods for simultaneous etching of the polysilicon films are a wet etching method, a dry etching method and the like.

EXAMPLES

Hereafter, examples of the method for manufacturing the CMOS semiconductor device in the present invention is described with reference to the attached drawings.

Example 1

FIGS. 1(a) to 1(e) are illustrations showing manufacturing steps for a semiconductor device having dual gates in accordance with the present invention. In FIGS. 1(a) to 1(e), reference numeral 1 represents a p type silicon substrate, 2 represents a device isolation film, 3 represents an NMOS transistor formation region, 4 represents a PMOS transistor formation region, 5 represents a gate insulating film, 6 represents a polysilicon film, 7a, 7b and 7c each represent a resist mask, 8 represents an n type polysilicon film of high impurity concentration, 9 represents a p type polysilicon film of high impurity concentration, 10 represents an n type gate electrode and 11 represents a p type gate electrode.

First, as shown in FIG. 1(a), the device isolation film 2 was formed on the p type silicon substrate 1 by means of LOCOS method. Then, the NMOS transistor formation region 3 and the PMOS transistor formation region 4 were formed in a portion of the p type silicon substrate 1 other than the device isolation region by means of an ordinary method. Next, the gate insulating film 5 of about 5 nm in thickness was formed on the silicon substrate 1. Then, the polysilicon film 6 of about 200 nm in thickness was deposited on the gate insulating film 5.

Figure 1B:
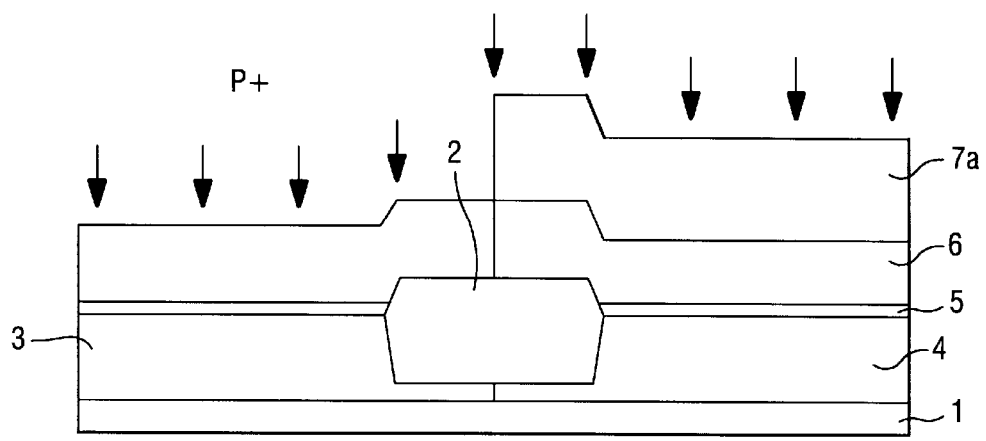

Second, as shown in FIG. 1(b), the resist mask 7a was formed so as to cover the PMOS transistor formation region 4. The $^{31}P^+$ as an n type impurity was implanted into the NMOS transistor formation region 3 with an implantation energy of about 20- about 40 keV in a dose of about $1.0 \times 10^{15}$ ions/cm² by using this resist mask 7a to provide the n type polysilicon film 8 of high impurity concentration.

Figure 1C:
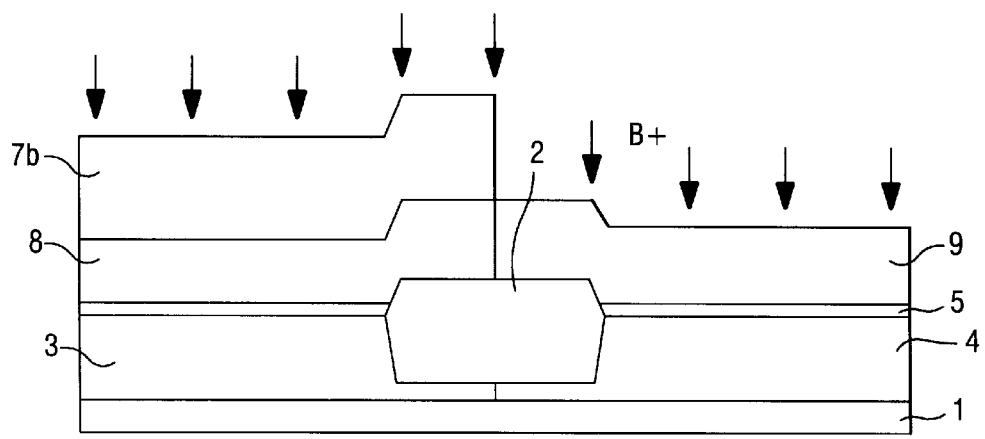

Third, as shown in FIG. 1(c), the resist mask 7a was removed. Then, the resist mask 7b was formed so as to cover the NMOS transistor formation region 3. Next, $^{11}B^+$ as a p type impurity was implanted into the PMOS transistor formation region 4 with an implantation energy of about 10 to about 20 keV in a dose of about $6.0 \times 10^{14}$ ions/cm² by using this resist mask 7b to provide the p type polysilicon film 9 of high impurity concentration.

Figure 1D:
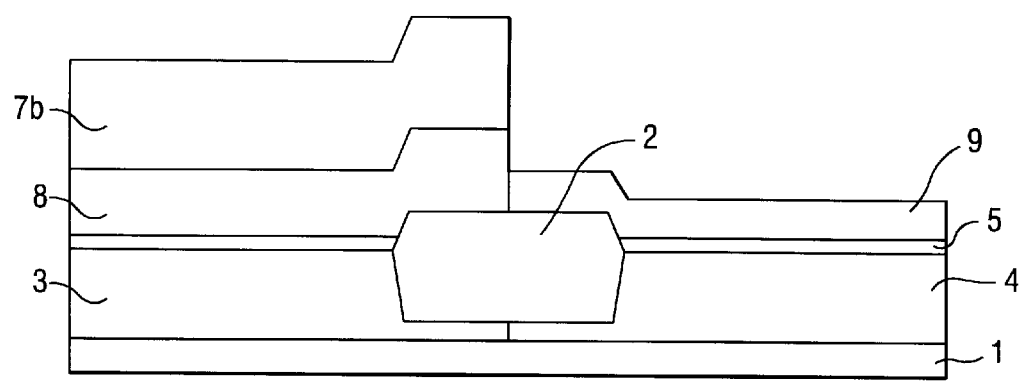

Then, as shown in FIG. 1(d), the p type polysilicon film 9 of high impurity concentration was etched by a thickness of about 15 nm with the resist mask 7b maintained as it was.

The thickness to be etched was obtained by calculation of the above-mentioned formula (1) using values where, under the later-mentioned etching method and condition, an etching rate of the n type polysilicon film 8 of high impurity concentration obtained above was about 340 nm/min.; an etching rate of the p type polysilicon film 9 of high impurity concentration obtained above was about 315 nm/min.; and a total thickness of the polysilicon film 6 was about 200 nm.

Figure 1E:
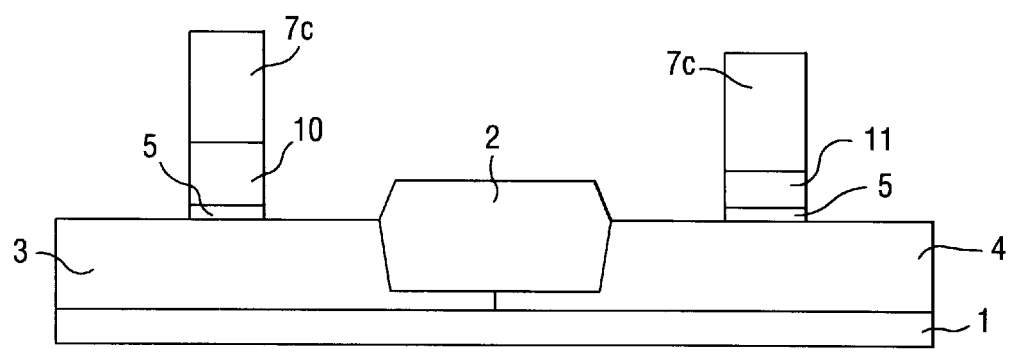
Figure 2A:
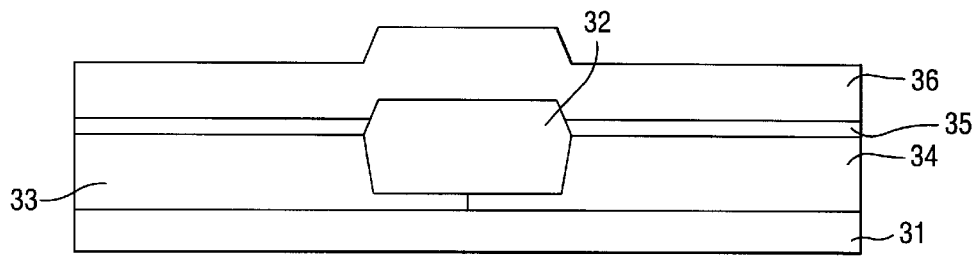
FIGS. 2(a) to 2(c) are schematic sectional views of a principal part illustrating conventional manufacturing steps for a CMOS semiconductor device.
Figure 2B:
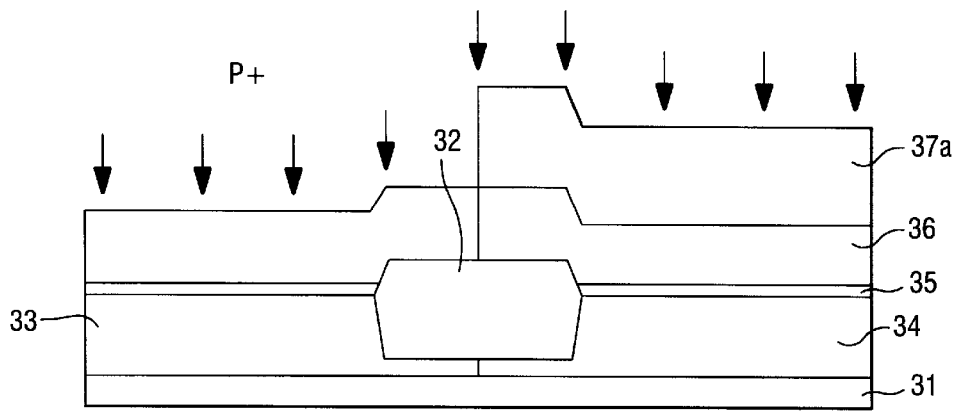
Figure 2C:
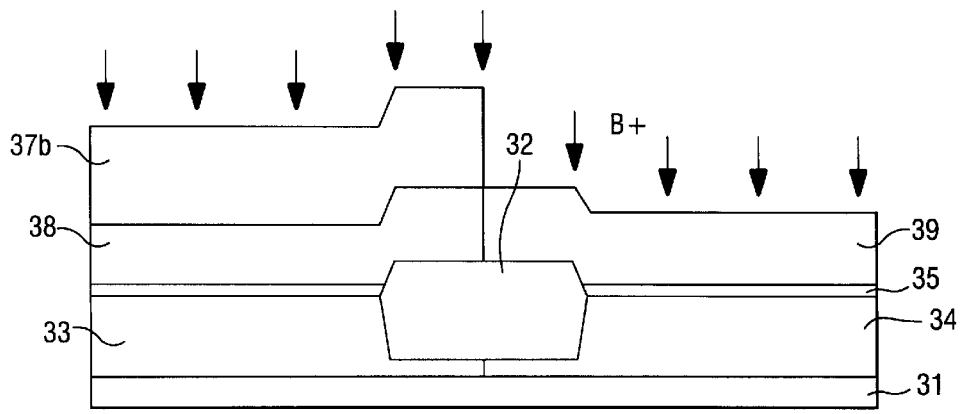
Figure 3A:
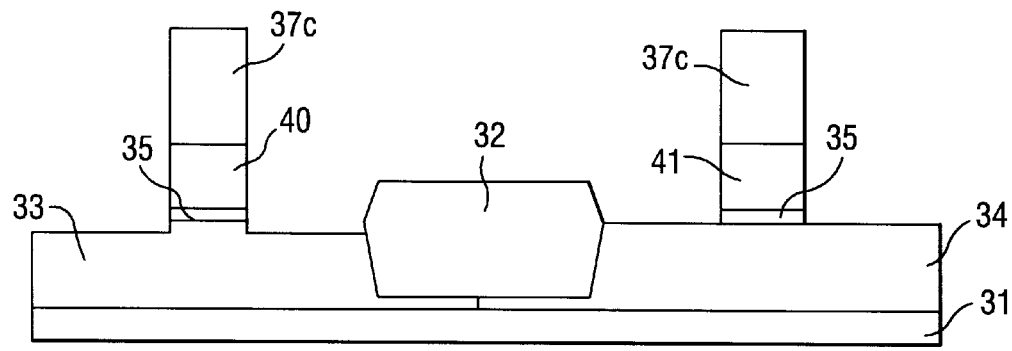
FIGS. 3(a) and 3(b) are schematic sectional views of a principal part for explaining a problem in the conventional method for manufacturing the CMOS semiconductor device.
Figure 3B:
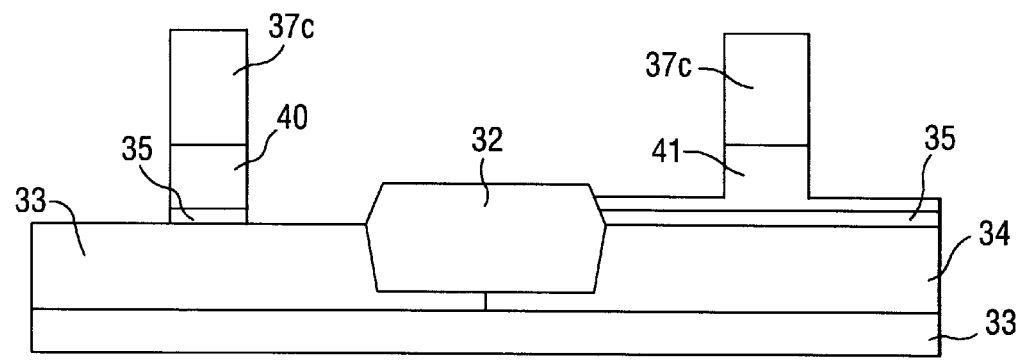

Then, as shown in FIG. 1(e), the resist mask 7b was removed.

Then, a thermal-treatment was conducted at the temperature of about 900 to about 950° C. in an atmosphere of nitrogen gas for about 30 to about 60 minutes. Next, a resist was applied on the entire surface of the silicon substrate 1. This resist was patterned in a desired shape by a photolithography and etching step to form the resist mask 7c. The n type polysilicon film 8 of high impurity concentration and the p type polysilicon film 9 of high impurity concentration were etched by using this resist mask 7c to form the n type gate electrode 10 and the p type gate electrode 11.

Here, the etching was conducted by means of a reactive-ion etching method in a mixed atmosphere of HBr, $Cl_2$ and $O_2$ gases (the ratio of HBr: $Cl_2$: $O_2$ being 20: 20: 7) at a pressure of 0.9 Pa with RF power of 13.56 MHz.

Thereafter, an interlayer insulating film, a contact hole, a wiring layer and the like were optionally formed to complete the CMOS semiconductor device.

The above-mentioned example has been explained with respect to the case in which $^{31}P^+$ is used as an n type impurity and $^{11}B^+$ is used as a p type impurity, but $^{75}As^+$ may be used as an n type impurity and $^{49}BF_2^+$ may be used as a p type impurity.

According to the present invention, when the first conductivity type polysilicon film of high impurity concentration and the second conductivity type polysilicon film of high impurity concentration are etched at the same time, the polysilicon films constituting the NMOS transistors and the PMOS transistors can be patterned without over-etching into the surface of the semiconductor substrate and without leaving the polysilicon film of high impurity concentration unetched. This is because, just before the etching, each polysilicon layer has the thickness corresponding to the different etching rate.

Accordingly, the present invention can afford a highly reliable semiconductor device wherein generation of short-circuit and leak current are suppressed without performing complicated manufacturing processes and with less manufacturing costs.

What is claimed is:

1. A method for manufacturing a CMOS semiconductor device having a first conductivity type MOS transistor including a gate electrode made of a first conductivity type polysilicon film of high impurity concentration and a second conductivity type MOS transistor including a gate electrode made of a second conductivity type polysilicon film of high impurity concentration on a single semiconductor substrate, comprising the steps of:

forming a polysilicon film on the semiconductor substrate;

forming a first resist mask on the polysilicon film so as to cover a second conductivity type MOS transistor formation region, followed by implanting a first conductivity type impurity at a high concentration into the polysilicon film by using the first resist mask thereby defining a first conductivity type polysilicon film;

removing the first resist mask;

forming a second resist mask on the polysilicon film so as to cover a first conductivity type MOS transistor formation region, followed by implanting a second conductivity type impurity at a high concentration into the polysilicon film by using the second resist mask thereby defining a second conductivity type polysilicon film;

etching the second conductivity type polysilicon film by a specific thickness by using the second resist mask, wherein said specific thickness is such that said second conductivity type polysilicon film has a different thickness than said first conductivity type polysilicon film and said specific thickness is defined based on a difference in respective etch rates between said first and second conductivity type polysilicon films;

removing the second resist mask;

thermally treating for uniformizing the impurity concentrations in the first conductivity type polysilicon film and the second conductivity type polysilicon film;

forming a third resist mask on the first conductivity type polysilicon film and the second conductivity type polysilicon film; and etching the first conductivity type polysilicon film and the second conductivity type polysilicon film simultaneously by using the third resist mask thereby forming the gate electrode made of the first conductivity type polysilicon film and the gate electrode made of the second conductivity type polysilicon film.

2. The method of claim 1, wherein the specific thickness of the second conductivity type polysilicon film is a thickness which is a product of an original thickness of the second conductivity type polysilicon film before etching and a value obtained by dividing an etching rate of the first conductivity type polysilicon film into an absolute value of a difference between the etching rate of the first conductivity type polysilicon film and an etching rate of the second conductivity type polysilicon film, when the first conductivity type polysilicon film and the second conductivity type polysilicon film are simultaneously etched.

3. The method of claim 1, wherein the concentration of the first conductivity type impurity and the concentration of the second conductivity type impurity in the polysilicon film after the thermal-treatment is each in the range from about $1\times10^{19}$ to about $1\times10^{20}$ ions/cm$^3$.

* * * * *